United States Patent [19]

Guajardo

[11] Patent Number: 5,027,020

[45] Date of Patent: Jun. 25, 1991

[54] ZERO VOLTAGE SWITCHING AC RELAY CIRCUIT

[75] Inventor: Ciro Guajardo, Harbor City, Calif.

[73] Assignee: Teledyne Industries, Inc., Los Angeles, Calif.

[21] Appl. No.: 418,890

[22] Filed: Oct. 10, 1989

[51] Int. Cl.$^5$ .................... H03K 17/72; H03K 17/13
[52] U.S. Cl. .................... 307/647; 307/631; 307/646; 307/311
[58] Field of Search ............. 307/631, 632, 643, 647, 307/646, 311

[56] References Cited

U.S. PATENT DOCUMENTS

| | | | |
|---|---|---|---|
| 3,328,606 | 6/1967 | Pinckaers | 307/647 |
| 3,816,763 | 6/1974 | Korn et al. | 307/632 |
| 4,396,932 | 8/1983 | Alonas et al. | 307/647 |

FOREIGN PATENT DOCUMENTS 0024406  2/1980  Japan .................. 307/631

Primary Examiner—John Zazworsky
Attorney, Agent, or Firm—Stephen L. King

[57] ABSTRACT

A zero voltage switching circuit for controlling current to a serially arranged load and AC voltage source including first and second photosensitive silicon controlled rectifiers having a gate, anode, and cathode terminals, the anode-cathode terminals being arranged to be connected in inverse parallel across the load and AC voltage source, apparatus for applying input signals to generate light to enable the first and second photosensitive silicon controlled rectifiers, apparatus for providing a voltage range within which the photosensitive silicon controlled rectifiers operate, apparatus for clamping the gate terminals of each of the photosensitive silicon controlled rectifiers to its cathode in the absence of input light signals to the photosensitive silicon controlled rectifiers, and apparatus for opening the circuit between the gate and rectifier of each photosensitive silicon controlled rectifier in the presence of input light signals.

9 Claims, 3 Drawing Sheets

ZERO VOLTAGE SWITCHING AC RELAY CIRCUIT

BACKGROUND OF THE INVENTION

1. Field of the Invention

This invention relates to relay circuits and, more particularly, to relay circuits which utilize photosensitive silicon-controlled rectifiers as active switching elements which are triggered into conduction only when the value of the AC voltage being controlled is within predetermined limits of zero volts.

2. History of the Prior Art

A number of circuits have been devised in the prior art to provide an AC relay consisting of a pair of inverse-parallel-connected photosilicon controlled rectifiers which are triggered into conduction by light emitting diode light sources optically coupled thereto through a transparent dielectric path. The light emitting diodes are in turn energized by an input signal and provide light output to impinge on the photosilicon controlled rectifiers to cause them to conduct and complete an output circuit between an AC power source and a load. Such relay circuits are widely used for the control of AC loads by computer generated logic signals such as are found in microcomputer based control systems. The optical coupling between the input signal circuit and the load circuit provide excellent electrical isolation between the logic signals and the AC loads. In addition, the photosilicon controlled rectifier relay circuit requires few components for its implementation. This simplicity permits the use of hybrid circuit construction techniques to provide solid state AC relay circuits which may be inexpensively mass produced in a very small package size.

For most applications, it is desirable to have an AC relay which switches on only at those points in time when the value of the AC voltage being controlled is close to zero. This eliminates a great deal of the transient problem which occurs if the relay is switched on at an instant when the AC voltage being controlled has a substantial value. This type of circuit action is known to those skilled in the art as zero voltage switching, although the actual switching action may occur within a range of voltages around zero. In general, circuits of the prior art providing zero voltage switching for AC relays using photosilicon controlled rectifiers possess a large number of components in order to achieve acceptable performance. Such circuits are expensive and thus obviate one of the main benefits of their use. In an effort to provide a zero voltage switching circuit using a minimum number of components, prior art designs have employed a transistor having its collector and emitter connected to the gate and cathode, respectively, of the photosilicon controlled rectifier. The transistor base is connected through a series current-limiting resistor to the anode of the silicon controlled rectifier so that the anode to cathode voltage of the silicon controlled rectifier controls the transistor. This circuit uses the transistor to clamp the gate to cathode circuit of the photosilicon controlled rectifier whenever the voltage across the silicon controlled rectifier anode-cathode circuit exceeds a predetermined value to prevent the silicon controlled rectifier from being triggered into conduction.

Unfortunately, the silicon controlled rectifier gate clamping circuit described has the effect of significantly increasing the level of light required to trigger the photosilicon controlled rectifier into conduction. Such an increase requires an increase in the light emitting diode current supplied by the input signal source to the point that prior art AC relay circuits employing zero voltage switching configurations could not be used in such an arrangement and be directly controlled by computer generated logic signals. These computer logic circuits are limited by the amount of current they can supply to drive the input of the AC relay circuit, so in order to work require additional amplifiers and power drivers to interface the prior art relay circuits to the computer logic.

For this and for other reasons, a new relay circuit including a pair of photosilicon controlled rectifiers connected in inverse parallel to provide full wave control of an AC voltage was devised and described in U.S. Pat. No. 4,339,670. This arrangement provides zero voltage switching by using the collector-emitter circuit of a transistor to shunt the gate-cathode circuit of the photosilicon controlled rectifier. The bases of transistors thus used with each silicon controlled rectifier are connected to each other by a single current limiting resistor. The emitter-base breakdown voltage of each transistor sets a predetermined zero voltage switching level and results in a zero voltage switching AC relay circuit which does not require high levels of input current for operation. Such a circuit functions well with computer generated logic signals.

Although this last described circuit provides improved performance, there are certain conditions in which some AC power sources generate abnormal amounts of electrical noise which, even using zero crossing circuitry such as described in the above-mentioned U.S. patent, causes the silicon controlled rectifiers to fail to turn on in response to input signals and cause so-called "dropout" half cycles.

SUMMARY OF THE INVENTION

It is, therefore, an object of the present invention to provide an improved solid state relay circuit for controlling alternating current loads.

It is another object of this invention to provide solid state relay circuits utilizing two photosilicon controlled rectifiers connected in inverse parallel to provide full wave control of an AC voltage and zero voltage switching circuitry which is impervious to transients in the load which might cause half cycle dropouts.

These and other objects of the invention are realized in a zero voltage switching circuit for controlling current to a serially arranged load and AC voltage source including first and second photosensitive silicon controlled rectifiers each having a gate, anode, and cathode terminals, the anode-cathode terminals being connected in inverse parallel across the load and AC voltage source, means for applying input signals to generate light to enable the first and second photosensitive silicon controlled rectifiers, means for providing a voltage range within which the photosensitive silicon controlled rectifiers operate, means for clamping the gate terminals of each of the photosensitive silicon controlled rectifiers to its cathode in the absence of input light signals to the photosensitive silicon controlled rectifiers, and means for opening the circuit between the gate and rectifier of each photosensitive silicon controlled rectifier in the presence of input light signals.

These and other features and objects of the invention will be better understood by those skilled in the art by reference to the detailed description which follows taken together with the drawings in which like designation refer to like elements through the several views.

DETAILED DESCRIPTION OF THE INVENTION

Figure 1:
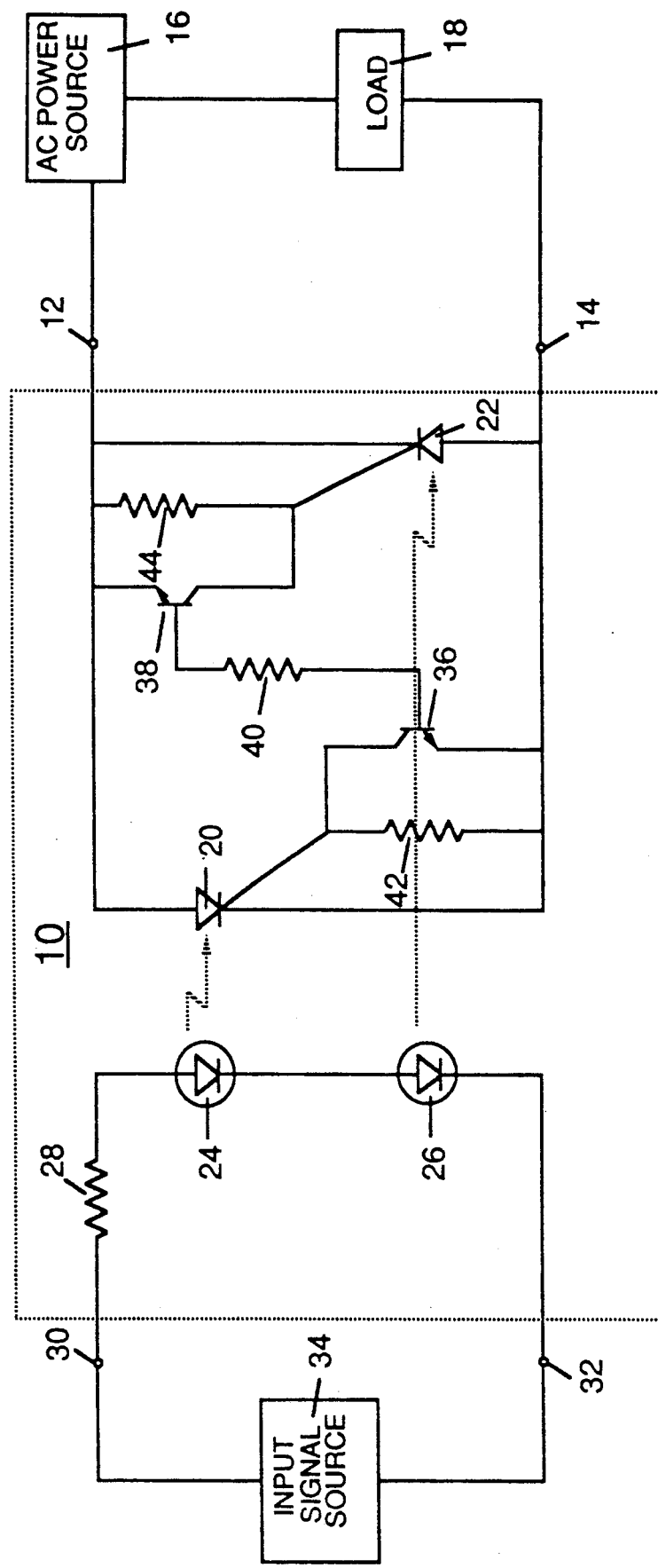
FIG. 1 is a circuit diagram illustrating the prior art.

FIG. 1 illustrates the prior art circuit shown in U.S. Pat. No. 4,339,670. In the zero voltage switching AC relay circuit 10, an AC power source 16 and a load 18 are connected in series between output terminals 12 and 14. The function of the circuit 10 is to provide an effectively open circuit between the output terminals 12 and 14 when the relay is not actuated so that the voltage 16 is not applied to the load 18 and to provide an effectively short circuit between the output terminals 12 and 14 when the relay is actuated, allowing AC voltage from the source 16 to be connected through the relay circuit to the load 18.

To accomplish this, a pair of photosilicon controlled rectifiers 20 and 22 are placed in inversed parallel between the terminals 12 and 14 to form a circuit which can conduct current in either direction and is thus suitable for full wave AC control. The two silicon controlled rectifiers 20 and 22 are arranged so that (when conducting) during the positive half cycles of AC power source 16 when the voltage at terminal 12 is positive with respect to the voltage at the terminal 14, the load current flows through the anode-cathode circuit of the photosilicon controlled rectifier 20. Conversely, during the negative half cycles of the AC power source 16, the load current flows through the anode-cathode circuit of the photosilicon controlled rectifier 22.

The photosilicon controlled rectifiers 20 and 22 are, respectively, placed in the conducting condition by two light emitting diodes 24 and 26 which are positioned adjacent to them. The light emitting diodes 24 and 26 are connected in series with a current limiting resistor 28 and an input signal source 34. When the input signal source 34 provides an input signal to the light emitting diodes 24 and 26, they generate light which is optically coupled to the photosilicon rectifiers 20 and 22. This triggers the rectifiers 20 and 22 into conduction providing a full wave conduction path from the AC power source 16 to the load 18. When the input signal source 34 is removed, the rectifiers 20 and 22 are transferred to the non-conducting state by the current reversals of the AC power source 16.

As so far described, the circuit 10 permits the input signal source 34 to trigger the photosilicon controlled rectifiers 20 and 22 into conduction at any voltage level of AC source 16. To prevent the relay circuit 10 from being switched on when the AC voltage source 16 has a substantial value and transients are a major problem, a zero voltage switching arrangement is provided by transistors 36 and 38 and a current limiting resistor 40. The NPN transistor 36 is connected with its collector and emitter at the gate and cathode, respectively, of the rectifier 20; and the NPN transistor 38 is connected with its collector and emitter at the gate and cathode, respectively, of the rectifier 22.

A photosilicon controlled rectifier device may be rendered non-responsive to input light sources by shunting the gate-cathode circuit through a low impedance path. These low impedance paths are provided by the transistors 36 and 38 when they are biased into conduction. This occurs when the voltage across the AC power source 16 exceeds predetermined voltage limits so that the rectifiers 20 and 22 are prevented from being triggered into conduction except within the predetermined voltage limits. During positive half cycles of the AC power source 16, the voltage across the anode-cathode circuit of the rectifiers 20 and 22 increases to the point where it exceeds the emitter-base breakdown voltage of the transistor 38. This causes bias current to be supplied through the base-emitter junction of the transistor 38 and the resistor 40 to the base of the transistor 36, causing the transistor 36 to conduct. In a like manner, during negative half cycles of the AC power source 16, when the voltage across the anode-cathode circuit of the rectifier 22 exceeds the emitter-base breakdown voltage of the transistor 36 it causes bias current to be supplied through the resistor 40 to the base of the transistor 38 causing the transistor 38 to conduct. The typical emitter-base breakdown voltage of NPN transistors 36 and 38 is approximately 9 to 12 volts. Accordingly, placing the resistor 40 between the bases of the transistors 36 and 38 permits the photosilicon controlled rectifiers 20 and 22 to be triggered into conduction for voltages provided by the AC power source 16 ranging between plus and minus 9 to 12 volts.

Figure 2:
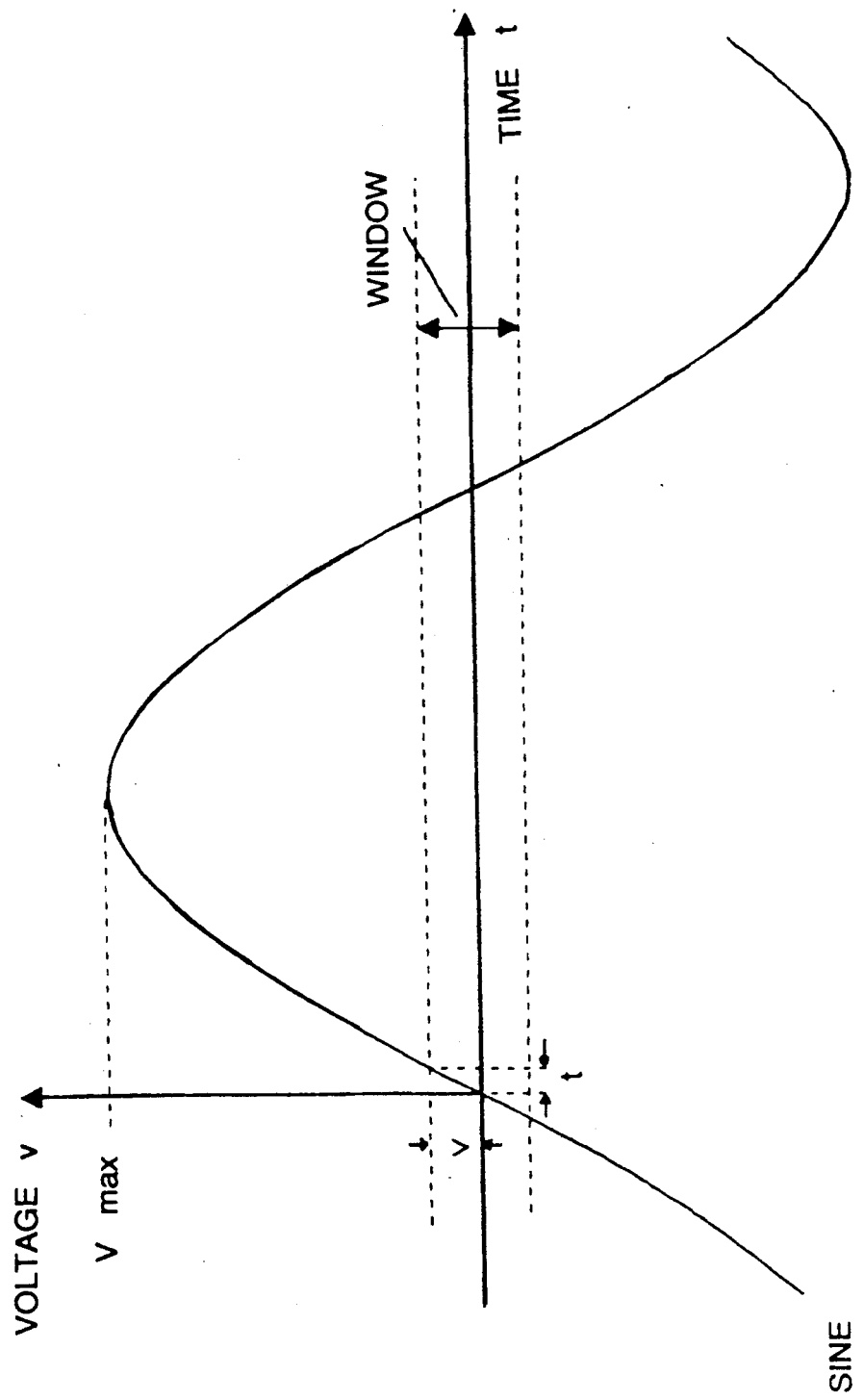
FIG. 2 is a diagram illustrating a sine wave of voltage to assist in describing difficulties encountered by the prior art.

Unfortunately the circuit 10 illustrated in FIG. 1 misses certain half cycles of operation when used with some power sources which generate abnormal amounts of electrical noise. The reason for this may be demonstrated by reference to FIG. 2 which illustrates a sine wave form of the voltage provided by the power source 16. The equation for the sine wave is given by $v = V_{max}$ sine $(2\pi ft)$, where $v$ is the instantaneous voltage, $V_{max}$ is the maximum peak voltage of the sine wave, $f$ is the frequency of the sine wave, $t$ is the time. Solving for $t$, $t = \frac{1}{2}\pi f$ x arc sine of $v/V_{max}$. $t$ is the time in which the relay must turn on before the zero turn-on circuit clamps the rectifiers 20 and 22 of FIG. 1.

As may be seen, $t$ is inversely proportional to both the frequency $f$ and the maximum voltage $V_{max}$. Typical line voltages used with these circuits provides for a maximum voltage of 115 volts at a frequency of 400 Hz, and a window of plus or minus 12 volts for the switching range so that $t$ equals approximately 30 microseconds. If the relay 10 of FIG. 1 does not turn on during this time, it must wait for the next half cycle, causing what is called a dropout.

Now, the silicon controlled rectifiers 20 and 22 may be rendered insensitive to noise disturbances by clamping their gate terminals to ground. This obviously cannot be done during the turn-on time during the period of the zero voltage window, so the values for resistors 42 and 44 in the prior art are chosen to be such that the rectifiers 20 and 22 are not easily turned on. However, apparently a very large amount of noise in the AC power source of the load can render the silicon controlled rectifiers 20 and 22 insensitive to the input light signals so that the dropouts occur. This invention has been devised to eliminate the dropout problem.

Figure 3:
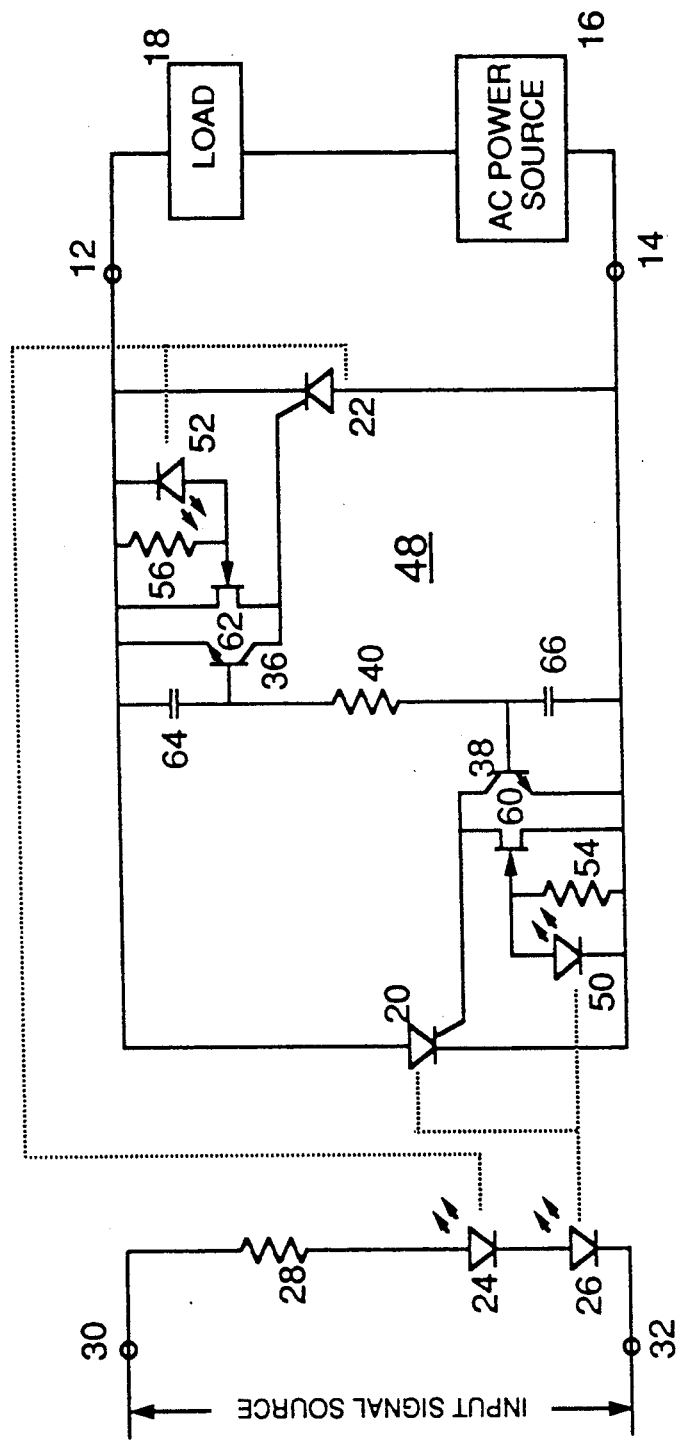
FIG. 3 is a circuit diagram illustrating the present invention.

The circuit 48 of FIG. 3 is similar to that illustrated in FIG. 1 except that the resistor 42 has been replaced by a junction FET transistor 60 having a gate biased by a resistor 54 connected in parallel with a light detecting diode (LDD) 50, the resistor 44 has been replaced by a junction FET transistor 62 having its gate biased by resistor 56 connected in parallel with a light detecting diode (LDD) 52, and capacitors 64 and 66 are connected at opposite sides of the resistor 40 to the output terminals 12 and 14.

In the circuit 48 of FIG. 3, the junction FET transistors 60 and 62 are normally conducting between source and drain. Thus, during the general operating condition of the circuit, the gates of each of the rectifiers 20 and 22 are essentially directly connected to the cathodes. In the absence of an input signal from the light emitting diodes 24 and 26, neither of the rectifiers 20 or 22 will be influenced by transients in the load to any extent even during the period in which the load voltage 16 is in the window area. In general, the impedance of the junction FET transistors 60 and 62 is less than 1,000 ohms, while that of the resistors which they replace is typically 25k ohms to 50k ohms.

On the other hand, the LDDs 50 and 52 are directly coupled to receive the light from the light emitting diodes 26 and 24, respectively, so that when input signals are provided from the input signal source to the rectifiers 20 and 22, the LDDs 50 and 52 generate a negative voltage at the gate of the respective junction transistors 60 or 62 which turns that transistor off. Turning off the transistor 60, for example, causes the gate of the silicon controlled rectifier 20 to float so that it is essentially an open circuit. This allows the silicon controlled rectifier 20 to turn on only in response to the signal provided by the light emitting diode 26 during the period of the window and entirely eliminates the effect of transients in the output load.

The transistor 62 operates in a similar manner in response to a negative voltage at its gate provided by the light emitting diode 52 to turn off the transistor 62 and provide an infinite impedance at the gate terminal of the silicon controlled rectifier 22 during the negative half cycles of the AC power source 16.

The transistors 36 and 38 respond in the same manner (as in FIG. 1) to the provision of current through the resistor 40 and the base-emitter junction of the transistors 36 or 38 to provide the limiting window so that zero voltage switching may occur. The capacitors 64 and 66 are arranged to bypass high frequency transients so that the transistors 36 and 38 will not turn on and clamp the gate terminals of the silicon controlled rectifiers 22 and 20 prematurely.

The circuit of this invention essentially eliminates drop-outs. It has been found that the new circuit illustrated in FIG. 3 is much less sensitive to transient noise, even in the zero voltage window area in the absence of input signals from the LEDs 24 and 26 because of the better clamping provided by the junction FETs 60 and 62. Moreover, the silicon controlled rectifiers 20 and 22 have better maximum sensitivity because the junction FETs 60 and 62 provide a virtually open circuit in the presence of input signals provided by the LEDs 26 and 24 coupled through the LDDs 50 and 52. Moreover, the interference of high frequency premature clamping has been minimized by means of the bypass r capacitors 66 and 64.

Although the relay circuit of this invention has been disclosed in the presently preferred embodiment, it will be obvious to those skilled in the art that various modifications and variations may be made without departing from the spirit and scope of the invention. It is therefore intended that the invention be defined only in terms of the claims which follow.

What is claimed is:

1. A zero voltage switching circuit for controlling current to a serially arranged load and AC voltage source comprising first and second photosensitive silicon controlled rectifiers each having gate, anode, and cathode terminals, the anode-cathode terminals being arranged to be connected in inverse parallel across the load and AC voltage source, means for applying input signals to generate light to enable the first and second photosensitive silicon controlled rectifiers, means for providing a voltage range within which the photosensitive silicon controlled rectifiers operate, means for clamping the gate terminal of each of the photosensitive silicon controlled rectifiers to its cathode terminal in the absence of input light signals to the photosensitive silicon controlled rectifiers, and means for removing the clamping between the gate terminal and the cathode terminal of each photosensitive silicon controlled rectifier in the presence of input light signals.

2. A zero voltage switching circuit as claimed in claim 1 in which the means for providing a voltage range within which the photosensitive silicon controlled rectifiers operate comprises means for clamping the gate terminal of the first photosensitive silicon controlled rectifier to its cathode terminal in response to preselected positive AC voltages provided by the AC voltage source, and means for clamping the gate terminal of the second photosensitive silicon controlled rectifier to its cathode terminal in response to preselected negative AC voltages provided by the AC voltage source.

3. A zero voltage switching circuit as claimed in claim 2 in which the means for clamping the gate terminal of the first photosensitive silicon controlled rectifier to its cathode terminal in response to preselected positive AC voltages provided by the AC voltage source comprises a first resistance and a first junction transistor having emitter, base, and collector terminals, the emitter and collector terminals being connected between the gate and cathode terminals of the first photosensitive silicon controlled rectifier; and the means for clamping the gate terminal of the second photosensitive silicon controlled rectifier to its cathode terminal in response to preselected negative AC voltages provided by the AC voltage source comprises a second resistance, and a second junction transistor having emitter, base, and collector terminals, the emitter and collector terminals being connected between the gate and cathode terminals of the second photosensitive silicon controlled rectifier; and a third resistance joining the base terminal of the first junction transistor to the base terminal of the second junction transistor.

4. A zero voltage switching circuit as claimed in claim 3 further comprising a first capacitor connecting the base terminal of the first junction transistor to the cathode terminal of the first photosensitive silicon controlled rectifier, and a second capacitor connecting the base terminal of the second junction transistor to the cathode terminal of the second photosensitive silicon controlled rectifier.

5. A zero voltage switching circuit as claimed in claim 1 in which the means for clamping the gate terminals of each of the photosensitive silicon controlled rectifiers to its cathode terminal in the absence of input light signals to the photosensitive silicon controlled rectifiers comprises a pair of junction field effect transistors, one each of the pair of transistors having its source and drain terminals respectively connecting the gate and cathode terminals of the associated one of the photosensitive controlled rectifiers.

6. A zero voltage switching circuit as claimed in claim 5 in which the means for removing the clamping between the gate terminal and the cathode terminal of each photosensitive silicon controlled rectifier in the presence of input light signals comprises a light detecting diode connected between the gate and source terminals of the junction field effect transistor associated with one of the photosensitive silicon controlled rectifiers and coupled to receive the light actuating the associated photosensitive silicon controlled rectifier.

7. A zero voltage switching circuit as claimed in claim 6 in which the means for providing a voltage range within which the photosensitive silicon controlled rectifiers operate comprises means for clamping the gate terminal of the first photosensitive silicon controlled rectifier to its cathode terminal in response to preselected positive AC voltages provided by the AC voltage source, and means for clamping the gate terminal of the second photosensitive silicon controlled rectifier to its cathode terminal in response to preselected negative AC voltages provided by the AC voltage source.

8. A zero voltage switching circuit as claimed in claim 7 in which the means for clamping the gate terminal of the first photosensitive silicon controlled rectifier to its cathode terminal in response to preselected positive AC voltages provided by the AC voltage source and the means for clamping the gate terminal of the second photosensitive silicon controlled rectifier to its cathode terminal in response to preselected negative AC voltages provided by the AC voltage source each comprise a resistance, and one of a pair of junction transistors each having its emitter and collector terminals connected between the gate and cathode terminals of the associated photosensitive silicon controlled rectifier and its base terminal connected through the resistance to the base terminal of the other junction transistor.

9. A zero voltage switching circuit as claimed in claim 8 further comprising a pair of capacitors, each connecting the base terminal of an associated one of the junction transistors to the cathode terminal of an associated one of the photosensitive silicon controlled rectifiers.

* * * * *